United States Patent
Yoshizaki et al.

(10) Patent No.: US 11,384,256 B2
(45) Date of Patent: Jul. 12, 2022

(54) POLISHING METHOD AND METHOD FOR MANUFACTURING SEMICONDUCTOR SUBSTRATE

(71) Applicant: FUJIMI INCORPORATED, Aichi (JP)

(72) Inventors: Yukinobu Yoshizaki, Aichi (JP); Satoru Yarita, Aichi (JP); Hirofumi Ikawa, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 17/198,867

(22) Filed: Mar. 11, 2021

(65) Prior Publication Data

US 2021/0292601 A1  Sep. 23, 2021

(30) Foreign Application Priority Data

Mar. 19, 2020 (JP) .............................. JP2020-049610

(51) Int. Cl.
*C09G 1/02* (2006.01)
*H01L 21/306* (2006.01)

(52) U.S. Cl.
CPC .......... *C09G 1/02* (2013.01); *H01L 21/30625* (2013.01)

(58) Field of Classification Search
None
See application file for complete search history.

(56) References Cited

U.S. PATENT DOCUMENTS

2013/0260650 A1* 10/2013 Shinoda ............ H01L 21/02024
  451/36
2017/0247574 A1* 8/2017 Takahashi ............. H01L 21/304
2017/0275498 A1* 9/2017 Tamada ............... C09K 3/1463

FOREIGN PATENT DOCUMENTS

JP  2006278981 A  10/2006

* cited by examiner

*Primary Examiner* — Roberts P Culbert
(74) *Attorney, Agent, or Firm* — Katten Munchin Rosenman LLP

(57) ABSTRACT

The present invention provides a polishing method in which the polishing speed of silicon germanium is sufficiently high, the etching of the silicon germanium is suppressed, and the selection ratio of the polishing speed of the silicon germanium is sufficiently high.

The present invention relates a polishing method including: polishing an object to be polished containing silicon germanium using a polishing composition, in which the polishing composition contains an abrasive, an inorganic salt, and a polishing accelerator having an acid group, and pH of the polishing composition is 8 or more.

17 Claims, No Drawings

POLISHING METHOD AND METHOD FOR MANUFACTURING SEMICONDUCTOR SUBSTRATE

CROSS-REFERENCE TO RELATED APPLICATION

The present application is based on Japanese Patent Application No. 2020-049610 filed on Mar. 19, 2020, and a disclosed content thereof is incorporated herein as a whole by reference.

BACKGROUND

1. Technical Field

The present invention relates to a polishing method and a method for manufacturing a semiconductor substrate.

2. Description of Related Arts

As one of the techniques for reducing the power consumption of transistors and improving performance (operating characteristics), channels using high mobility materials that have higher carrier mobility than Si (hereinafter, simply referred to as "high mobility materials") have been considered. In a channel manufactured by using such a high mobility material and having improved carrier transport characteristics, the drain current flowing when a specified gate voltage is applied can be increased. Thus, it is possible to obtain the advantage that the power supply voltage can be lowered while obtaining a sufficiently high drain current. This advantage results in higher performance of MOSFETs (metal oxide semiconductor field-effect transistors) at low power.

As the high mobility materials, application of group III-V compounds, group IV compounds, Ge (germanium), graphene consisting only of C (carbon), and the like is expected. In particular, group III-V compounds containing As, group IV compounds containing Ge, and the like have been actively investigated.

A channel using the high mobility material can be formed by polishing an object to be polished, such as silicon germanium (SiGe), having a portion containing the high mobility material (hereinafter, also referred to as a high mobility material portion) and a portion containing a silicon material (hereinafter, also referred to as a silicon material portion). At this time, in addition to polishing the high mobility material portion at a high polishing speed to process it into a smooth surface, it is demanded to suppress the occurrence of a step due to etching on the polished surface of the object to be polished. For example, JP 2006-278981 A (corresponding to US 2006/218867 A) discloses a polishing composition used for polishing a Ge substrate.

SUMMARY

Recently, as a semiconductor substrate, a substrate containing both silicon germanium and other materials such as silicon nitride (SiN) has been used. In such a substrate, there is a new demand for polishing silicon germanium at a high polishing speed, suppressing etching of the silicon germanium, and further polishing the silicon germanium selectively. No consideration has been given to such demand in the past.

Therefore, it is an object of the present invention to provide a polishing method in which the polishing speed of silicon germanium is sufficiently high, the etching of the silicon germanium is suppressed, and the selection ratio of the polishing speed of the silicon germanium is sufficiently high.

In order to solve the above-mentioned new problem, the present inventors have accumulated intensive research. As a result, it has been found that the above-mentioned problem is solved by a polishing method including polishing an object to be polished (a polishing object) containing silicon germanium using a polishing composition containing an abrasive, an inorganic salt, and a polishing accelerator having an acid group and pH of the polishing composition is 8 or more, and the present invention has been completed.

DETAILED DESCRIPTION

Hereinafter, an embodiment of the present invention will be described. Note that the present invention is not limited to the embodiment described below. Unless otherwise specified in the present specification, operations and measurement of physical properties and the like are performed under the conditions of room temperature (20° C. or more and 25° C. or less)/relative humidity of 40% RH or more and 50% RH or less.

The polishing method according to one embodiment of the present invention includes polishing an object to be polished (a polishing object) containing silicon germanium using a polishing composition. The polishing composition contains an abrasive, an inorganic salt, and a polishing accelerator having an acid group, and pH of the polishing composition is 8 or more. In such polishing method according to one embodiment of the present invention, the polishing speed of the silicon germanium is sufficiently high, the etching of the silicon germanium is suppressed, and the selection ratio of the polishing speed of the silicon germanium is sufficiently high.

The mechanism by which the above-mentioned effect of the present invention can be obtained is considered to be as described below. However, the mechanism described below is only speculation, and this does not limit the scope of the present invention.

The polishing accelerator having an acid group is adsorbed on the surface of a silicon germanium film (hereinafter, also simply referred to as a Ge oxide film) oxidized by the action of an oxidizing agent or the like, and partially modifies the Ge oxide film. The modified Ge oxide film is rich in processability and the polishing speed increases, but it is presumed that dissolution is unlikely to occur and etching is suppressed. The polishing accelerator having an acid group is also adsorbed on the surface of films other than of the silicon germanium, but the action is weak and the surface is not modified. Therefore, the polishing speed of other films can be kept low.

Further, when the polishing composition contains an inorganic salt, the electrical conductivity of the polishing composition is increased. As a result, it is presumed that an electric double layer formed on the surface of the silicon germanium film is compressed, the action of the abrasive is improved, and the polishing speed of the silicon germanium film is increased.

Due to the above-mentioned action mechanism, according to the polishing method of the present invention, it is considered that the effect that the polishing speed of the silicon germanium is sufficiently high, the etching of the silicon germanium is suppressed, and the selection ratio of the polishing speed of the silicon germanium is sufficiently high can be obtained.

[Object to be Polished]

The object to be polished according to the present invention contains silicon germanium. The germanium content in the silicon germanium, which is an object to be polished, is preferably 10% by mass or more.

The object to be polished according to the present invention may contain other silicon-containing materials as long as it contains silicon germanium. Examples of the silicon-containing material include elemental silicon and silicon compounds. Further, examples of the elemental silicon include single crystal silicon, polycrystalline silicon (polysilicon, Poly-Si), amorphous silicon, and the like. Examples of the silicon compound include silicon nitride (SiN), silicon oxide ($SiO_2$), silicon carbide, and the like. The silicon-containing material also contains a low dielectric constant material in which the relative permittivity is 3 or less.

Examples of films containing silicon oxide include a TEOS (Tetraethyl Orthosilicate) type silicon oxide film (hereinafter, also simply referred to as a "TEOS film") formed using tetraethyl orthosilicate as a precursor, a HDP (High Density Plasma) film, a USG (Undoped Silicate Glass) film, a PSG (Phosphorus Silicate Glass) film, a BPSG (Boron-Phospho Silicate Glass) film, a RTO (Rapid Thermal Oxidation) film, and the like.

Next, the composition of the polishing composition used in the polishing method of the present invention will be described in detail.

The polishing composition used in the present invention contains an abrasive, an inorganic salt, and a polishing accelerator having an acid group, and pH of the polishing composition is 8 or more. That is, the present invention also provides a polishing composition used for polishing an object to be polished containing silicon germanium, which contains an abrasive, an inorganic salt, and a polishing accelerator having an acid group, and pH of the polishing composition is 8 or more.

[Abrasive (Abrasive Grains)]

The polishing composition used in the present invention contains an abrasive. The abrasive has an action of mechanically polishing the object to be polished, and improve the polishing speed of the object to be polished by the polishing composition.

The abrasive used may be any of inorganic particles, organic particles, and organic-inorganic composite particles. Specific examples of the inorganic particles include particles made of metal oxides such as silica, alumina, ceria, and titania, silicon nitride particles, silicon carbide particles, and boron nitride particles. Specific examples of the organic particles include polymethylmethacrylate (PMMA) particles. As the abrasive, a single type or a combination of two or more types may be used. Further, as the abrasive, a commercially available product or a synthetic product may be used.

Among these abrasives, silica is preferable, and colloidal silica is particularly preferable.

The shape of the abrasive grains is not particularly limited, and may be spherical or non-spherical. Specific examples of the non-spherical shape include, but are not particularly limited to, various shapes including a polygonal prism shape such as a triangular prism and a quadrangular prism, a cylindrical shape, a bale shape with the central part of the cylinder bulging beyond the ends, a donut shape with the central part of the disk opened, a plate shape, a so-called cocoon shape with a constriction at the central part, a so-called associative spherical shape in which a plurality of particles are integrated, a so-called Kompeito shape having a plurality of protrusions on the surface, a rugby ball shape, and the like.

When colloidal silica is used as the abrasive, the surface of the colloidal silica may be surface-modified with a silane coupling agent or the like.

Examples of the method of surface-modifying the surface of colloidal silica with a silane coupling agent include immobilization methods described below. For example, it can be carried out by the method described in "Sulfonic acid-functionalized silica through of thiol groups", Chem. Commun. 246-247 (2003). Specifically, a silane coupling agent having a thiol group such as 3-mercaptopropyltrimethoxysilane is coupled to colloidal silica and then the thiol group is oxidized using hydrogen peroxide so that the colloidal silica with sulfonic acid immobilized on the surface can be obtained.

Alternatively, for example, it can be carried out by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, a silane coupling agent containing a photoreactive 2-nitrobenzyl ester is coupled to colloidal silica and then irradiated with light so that the colloidal silica with a carboxylic acid immobilized on the surface can be obtained.

The above is colloidal silica having an anionic group (anion-modified colloidal silica), but colloidal silica having a cationic group (cationically modified colloidal silica) may be used. Examples of colloidal silica having a cationic group include colloidal silica with an amino group immobilized on the surface. Examples of a method for producing such colloidal silica having a cationic group include a method of immobilizing a silane coupling agent having an amino group such as aminoethyltrimethoxysilane, aminopropyltrimethoxysilane, aminoethyltriethoxysilane, aminopropyltriethoxysilane, aminopropyldimethylethoxysilane, aminopropylmethyldiethoxysilane, and aminobutyltriethoxysilane on the surface of colloidal silica, as described in JP 2005-162533 A. From the above method, the colloidal silica with an amino group immobilized on the surface can be obtained.

The size of the abrasive grains is not particularly limited. For example, when the abrasive grains are spherical, the average primary particle size of the abrasive grains is preferably 5 nm or more, more preferably 10 nm or more, and further preferably 15 nm or more. As the average primary particle size of the abrasive grains increases, the polishing speed of the object to be polished by the polishing composition increases. Further, the average primary particle size of the abrasive grains is preferably 120 nm or less, more preferably 80 nm or less, and further preferably 50 nm or less. As the average primary particle size of the abrasive grains becomes smaller, it becomes easier to obtain a surface with few defects by polishing using the polishing composition. That is, the average primary particle size of the abrasive grains is preferably 5 nm or more and 120 nm or less, more preferably 10 nm or more and 80 nm or less, and further preferably 15 nm or more and 50 nm or less. The average primary particle size of the abrasive grains can be calculated, for example, based on the specific surface area (SA) of the abrasive grains calculated by the BET method, assuming that the shape of the abrasive grains is a true sphere. In the present specification, the average primary particle size of the abrasive grains adopts the value measured by the method described in the examples.

Further, the average secondary particle size of the abrasive grains is preferably 30 nm or more, more preferably 40 nm or more, and further preferably 50 nm or more. As the average secondary particle size of the abrasive grains increases, the resistance during polishing decreases, and stable polishing becomes possible. Further, the average secondary particle size of the abrasive grains is preferably 250 nm or less, more preferably 200 nm or less, and further preferably 150 nm or less. As the average secondary particle size of the abrasive grains decreases, the surface area of the abrasive grains per unit mass increases, the frequency of contact with the object to be polished increases, and the polishing speed further increases. That is, the average secondary particle size of the abrasive grains is preferably 30 nm or more and 250 nm or less, more preferably 40 nm or more and 200 nm or less, and further preferably 50 nm or more and 150 nm or less. The average secondary particle size of the abrasive grains can be measured by, for example, a dynamic light scattering method typified by a laser diffraction/scattering method.

The average degree of association of the abrasive grains is preferably 5.0 or less, more preferably 4.0 or less, and further preferably 3.0 or less. As the average degree of association of the abrasive grains becomes smaller, defects can be further reduced. Further, the average degree of association of the abrasive grains is preferably 1.0 or more, more preferably 1.5 or more, and further preferably 2.0 or more. This average degree of association is obtained by dividing the value of the average secondary particle size of the abrasive grains by the value of the average primary particle size. There is an advantageous effect that as the average degree of association of the abrasive grains increases, the polishing speed of the object to be polished by the polishing composition increases.

The upper limit of the aspect ratio of the abrasive grains in the polishing composition is not particularly limited, but is preferably less than 2.0, more preferably 1.8 or less, and further preferably 1.5 or less. Within such ranges, defects on the surface of the object to be polished can be further reduced. The aspect ratio is an average of values obtained by taking the smallest rectangle circumscribing an image of the abrasive grain particles with a scanning electron microscope and dividing the length of the long side of the rectangle by the length of the short side of the same rectangle, and can be obtained by using general image analysis software. The lower limit of the aspect ratio of the abrasive grains in the polishing composition is not particularly limited, but is preferably 1.0 or more.

In the particle size distribution of the abrasive grains obtained by the laser diffraction/scattering method, the lower limit of D90/D10, which is the ratio of the diameter (D90) of particles when the integrated particle weight reaches 90% of the total particle weight from the fine particle side to the diameter (D10) of the particles when the integrated particle weight reaches 10% of the total particle weight from the fine particle side, is not particularly limited, but is preferably 1.1 or more, more preferably 1.2 or more, and further preferably 1.3 or more. Further, in the particle size distribution of the abrasive grains in the polishing composition obtained by the laser diffraction/scattering method, the upper limit of D90/D10, which is the ratio of the diameter (D90) of particles when the integrated particle weight reaches 90% of the total particle weight from the fine particle side to the diameter (D10) of the particles when the integrated particle weight reaches 10% of the total particle weight from the fine particle side, is not particularly limited, but is preferably 2.04 or less. Within such ranges, defects on the surface of the object to be polished can be further reduced.

The size of the abrasive grains (average primary particle size, average secondary particle size, aspect ratio, D90/D10, and the like) can be appropriately controlled by selecting the manufacturing method of an abrasive or the like.

The content (concentration) of the abrasive in the polishing composition is not particularly limited, but is preferably 0.05% by mass or more, more preferably 0.1% by mass or more, further preferably 0.3% by mass or more relative to the total mass of the polishing composition. Further, the upper limit of the content (concentration) of the abrasive is preferably 20% by mass or less, more preferably 10% by mass or less, and further preferably 5% by mass or less relative to the total mass of the polishing composition. That is, the content of the silica is preferably 0.05% by mass or more and 20% by mass or less, more preferably 0.1% by mass or more and 10% by mass or less, and further preferably 0.3% by mass or more and 5% by mass or less relative to the total mass of the polishing composition. Within such ranges, the polishing speed of the object to be polished can be improved while suppressing the cost. Note that when the polishing composition contains two or more types of abrasives, the content (concentration) of the abrasive is intended to be the total amount of these.

[Inorganic Salt]

The polishing composition used in the present invention contains an inorganic salt. Such inorganic salt increases the electrical conductivity of the polishing composition and compresses the electric double layer on the surface of the silicon germanium. Therefore, the action of the abrasive on the surface of the silicon germanium is improved, and the polishing speed of the silicon germanium is increased.

The inorganic salt is not particularly limited, and examples include a monovalent inorganic acid salt, a divalent inorganic acid salt, a trivalent inorganic acid salt, and the like.

Examples of the monovalent inorganic acid include hydrochloric acid, nitric acid, nitrous acid and the like. Examples of the divalent inorganic acid include sulfuric acid, carbonic acid, sulfurous acid, thiosulfuric acid, phosphonic acid and the like. Examples of the trivalent inorganic acid include phosphoric acid, phosphomolybdic acid, phosphotungstic acid, vanadic acid and the like.

Examples of these monovalent inorganic acid salt, divalent inorganic acid salt, and trivalent inorganic acid salt include lithium salt, sodium salt, potassium salt, calcium salt, magnesium salt, ammonium salt, and the like.

More specific examples of the inorganic salt include sodium nitrate, potassium nitrate, ammonium nitrate, magnesium nitrate, calcium nitrate, sodium nitrite, potassium nitrite, lithium carbonate, sodium carbonate, potassium carbonate, magnesium carbonate, calcium carbonate, lithium hydrogen carbonate, sodium hydrogen carbonate, potassium hydrogen carbonate, ammonium carbonate, sodium bicarbonate, sodium sulfate, potassium sulfate, ammonium sulfate, calcium sulfate, magnesium sulfate, sodium sulfite, potassium sulfite, calcium sulfite, magnesium sulfite, potassium thiosulfate, lithium sulfate, magnesium sulfate, sodium thiosulfate, sodium hydrogen sulfite, ammonium hydrogen sulfate, lithium hydrogen sulfate, sodium hydrogen sulfate, potassium hydrogen sulfate, trilithium phosphate, tripotassium phosphate, trisodium phosphate, triammonium phosphate, disodium hydrogen phosphate, dipotassium hydrogen phosphate, diammonium hydrogen phosphate, sodium dihydrogen phosphate, potassium dihydrogen phosphate, ammonium dihydrogen phosphate and the like. As the inorganic salt, a single type or a combination of two or more types may be used.

Among these, at least one selected from the group consisting of ammonium nitrate, ammonium sulfate, ammonium hydrogen sulfate, triammonium phosphate, diammonium hydrogen phosphate, and ammonium dihydrogen phosphate is preferable from the viewpoint of preventing metal contamination of the object to be polished, and ammonium sulfate is more preferable.

The content (concentration) of the inorganic salt in the polishing composition used in the present invention is not particularly limited, but is preferably 0.01% by mass or more, more preferably 0.02% by mass or more, further preferably 0.05% by mass or more relative to the total mass of the polishing composition. Further, the upper limit of the content (concentration) of the inorganic salt in the polishing composition used in the present invention is preferably 5% by mass or less, more preferably 3% by mass or less, and further preferably 1% by mass or less relative to the total mass of the polishing composition. Within such ranges, the polishing speed of the silicon germanium is further increased.

Note that when the polishing composition contains two or more types of inorganic salts, the content (concentration) of the inorganic salts is intended to be the total amount of these.

[Polishing Accelerator Having an Acid Group]

The polishing composition used in the present invention contains a polishing accelerator having an acid group (hereinafter, also simply referred to as a "polishing accelerator"). The polishing accelerator having an acid group adsorbs on the surface of the Ge oxide film and partially modifies the Ge oxide film. The modified Ge oxide film is rich in processability and the polishing speed increases, but it is presumed that dissolution is unlikely to occur and etching is suppressed.

Examples of the acid group include a carboxy group, a phosphate group, a phosphonate group, a sulfate group, a sulfonate group and the like.

Specific examples of the polishing accelerator having an acid group include ethylenediamine tetraacetic acid, nitrilotriacetic acid, hydroxyethylethylenediaminetriacetic acid, diethylenetriaminepentaacetic acid, triethylenetetraminehexacetic acid, and N-(2-hydroxyethyl)ethylenediamine-N,N',N'-triacetic acid, glycol ether diamine tetraacetic acid, 1,3-propanediamine-N,N,N',N'-tetraacetic acid, 1,3-diamino-2-propanol-N,N,N',N'-tetraacetic acid, N-(2-hydroxyethyl)iminodiacetic acid, methyl acid phosphate, ethyl acid phosphate, ethylene glycol acid phosphate, isopropyl acid phosphate, phytic acid, 1-hydroxyethylidene-1,1-diphosphonic acid, aminotri(methylenephosphonic acid), diethylenetriaminepenta(methylenephosphonic acid), aminopoly(methylenephosphonic acid), 2-aminoethylphosphonic acid, nitrilotri(methylenephosphonic acid), N,N,N',N'-ethylenediaminetetrakis(methylenephosphonic acid), diethylenetriaminepenta(methylenephosphonic acid), ethane-1,1-diphosphonic acid, ethanehydroxy-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 2-phosphonobutane-1,2,4-tricarboxylic acid, α-methylphosphonosuccinic acid, N,N-di(2-hydroxyethyl)glycine, aspartic acid, glutamic acid, dicarboxymethyl glutamic acid, (S,S)-ethylenediamine-N,N'-disuccinic acid, 2,3-dihydroxybenzoic acid, iminodiacetic acid, ethidroic acid, mugineic acid, salts thereof, and the like.

As the polishing accelerator, a single type or a combination of two or more types may be used. Further, as the polishing accelerator, a synthetic product or a commercially available product may be used. Examples of the commercially available polishing accelerator include Chelest PH-430, Chelest PH-540, Chelest GA, Chelest EDDS-4H, Chelest HA (all manufactured by Chelest Corporation) and the like.

Among these polishing accelerators, from the viewpoint that the processing speed of the silicon germanium can be independently increased without changing the processing speed of other types of films such as a silicon oxide film and a silicon nitride film, at least one selected from the group consisting of N-(2-hydroxyethyl)ethylenediamine-N,N',N'-triacetic acid, N,N,N',N'-ethylenediaminetetrakis(methylenephosphonic acid), 2-phosphonobutane-1,2,4-tricarboxylic acid, N,N-di(2-hydroxyethyl)glycine, aspartic acid, and (S,S)-ethylenediamine-N,N'-disuccinic acid is preferable, and N,N,N',N'-ethylenediaminetetrakis(methylenephosphonic acid) is more preferred.

The content (concentration) of the polishing accelerator in the polishing composition used in the present invention is not particularly limited, but is preferably 0.01% by mass or more, more preferably 0.05% by mass or more, further preferably 0.08% by mass or more relative to the total mass of the polishing composition.

Further, the upper limit of the content (concentration) of the polishing accelerator in the polishing composition used in the present invention is preferably 5% by mass or less, more preferably 3% by mass or less, and further preferably 1% by mass or less relative to the total mass of the polishing composition. Within such ranges, the polishing speed of the silicon germanium is further increased.

Note that when the polishing composition contains two or more types of polishing accelerators, the content (concentration) of the polishing accelerators is intended to be the total amount of these.

Further, the content mass ratio of the abrasive and the polishing accelerator in the polishing composition is preferably abrasive/polishing accelerator=1/1 to 13/1, and more preferably 1.5/1 to 10/1, and further preferably 2/1 to 7/1.

[pH]

The pH of the polishing composition used in the present invention is 8 or more. When the pH is less than 8, the action of the polishing accelerator on the silicon germanium film (Ge oxide film) does not proceed sufficiently, and a sufficient polishing speed cannot be obtained.

The pH is preferably 8.5 or higher, more preferably 9.0 or higher, and further preferably 10.0 or higher. On the other hand, from the viewpoint of safety, the pH of the polishing composition is preferably 13.0 or less, more preferably 12.0 or less, and further preferably 11.0 or less.

The pH of the polishing composition can be measured with a pH meter (manufactured by HORIBA, Ltd., model number: LAQUA).

(pH Adjusting Agent)

The polishing composition used in the present invention may contain a pH adjusting agent to obtain the above pH. The pH adjusting agent is not particularly limited as long as it is a compound having a pH adjusting function, and known compounds can be used. The pH adjusting agent is not particularly limited as long as it has a pH adjusting function, and examples thereof include acids, alkalis, and the like.

As the acid, either an inorganic acid or an organic acid may be used. The inorganic acid is not particularly limited, and examples thereof include sulfuric acid, nitric acid, boric acid, carbonic acid, hypophosphoric acid, phosphorous acid, phosphoric acid, and the like. The organic acid is not particularly limited, and examples thereof include carboxylic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and sulfonic acids such as methanesulfonic acid, ethanesulfonic acid and isethionic acid, and the like.

The alkali is not particularly limited, and examples thereof include hydroxides of alkali metals such as potassium hydroxide, ammonia, quaternary ammonium salts such as tetramethylammonium and tetraethylammonium, amines such as ethylenediamine and piperazine, and the like. Of these, ammonia is preferable.

The pH adjusting agent, a single type or a combination of two or more types may be used.

The content of the pH adjusting agent is not particularly limited, and may be appropriately adjusted so that the polishing composition has a desired pH.

[Dispersing Medium]

The polishing composition used in the present invention preferably contains a dispersing medium for dispersing each component. Examples of the dispersing medium include water; alcohols such as methanol, ethanol and ethylene glycol; ketones such as acetone or the like, mixtures thereof, and the like. Of these, water is preferable as the dispersing medium. That is, according to a more preferable embodiment of the present invention, the dispersing medium includes water. According to a further preferable embodiment of the present invention, the dispersing medium consists essentially of water. The above "essentially" means that a dispersing medium other than water can be contained as long as the object effect of the present invention can be achieved, and more specifically, the dispersing medium preferably includes water of 90% by mass or more and 100% by mass or less and a dispersing medium other than water of 0% by mass or more and 10% by mass or less, and it more preferably includes water of 99% by mass or more and 100% by mass or less and a dispersing medium other than water of 0% by mass or more and 1% by mass or less. Most preferably, the dispersing medium is water.

From the viewpoint of not inhibiting the action of the components contained in the polishing composition, water containing as little impurities as possible is preferable as the dispersing medium, and specifically, pure water or ultrapure water from which impurity ions have been removed with an ion exchange resin and then foreign substances (contaminants) have been removed through a filter; or distilled water is more preferable.

[Other Components]

The polishing composition of the present invention may further contain other components such as an oxidizing agent (an oxidant), a complexing agent, an antiseptic agent, and an antifungal agent, if necessary. Hereinafter, other components such as an oxidizing agent, an antiseptic agent, and an antifungal agent will be described.

(Oxidizing Agent)

The polishing composition used in the present invention preferably contains an oxidizing agent (an oxidant). The oxidizing agent has an action of oxidizing the surface of the silicon germanium, and can further improve the polishing speed of the silicon germanium film by the polishing composition.

Examples of the oxidizing agent include hydrogen peroxide, sodium peroxide, barium peroxide, ozone water, silver (II) salt, iron (III) salt, permanganic acid, chlomic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorite acid, perchloric acid, bromic acid, iodic acid, periodic acid, persulfuric acid, dichloroisocyanuric acid, salts thereof, and the like. As the oxidizing agent, a single type or a combination of two or more types may be used. Among these, hydrogen peroxide, ammonium persulfate, periodic acid, hypochlorous acid, and sodium dichloroisocyanurate are preferable, and hydrogen peroxide is more preferable.

The lower limit of the content (concentration) of the oxidizing agent in the polishing composition is preferably 0.001% by mass or more, and preferably 0.01% by mass or more. By setting the lower limit as above, the polishing speed of the silicon germanium can be further improved. Further, the upper limit of the content (concentration) of the oxidizing agent in the polishing composition is preferably 5% by mass or less, and more preferably 3% by mass or less. By setting the upper limit as above, in addition to being able to reduce the material cost of the polishing composition, it is possible to reduce the load of treatment of the polishing composition after used for polishing, that is, the load of waste water treatment. Further, it is also possible to reduce the possibility of occurrence of excessive oxidation of the surface of the object to be polished by the oxidizing agent.

(Antiseptic Agent and Antifungal Agent)

Examples of the antiseptic agent and the antifungal agent include isothiazolin-based antiseptic agents such as 2-methyl-4-isothiazolin-3-one, 5-chloro-2-methyl-4-isothiazolin-3-one, 1,2-benzisothiazolin-3-one, and 2-n-octyl-4-isothiazolin-3-one, paraoxybenzoic acid esters, orthophenylphenol, phenoxyethanol, and the like. As the antiseptic agent and the antifungal agent, a single type or a combination of two or more types may be used.

[Method for Producing the Polishing Composition]

The method for producing the polishing composition of the present invention is not particularly limited, and, the polishing composition can be obtained, for example, by stirring and mixing the abrasive, the inorganic salt, the polishing accelerator having an acid group, and, if necessary, other additives in the dispersing medium (for example, water). Details of each component are as described above. Therefore, the present invention provides a method for producing the polishing composition of the present invention, which includes mixing the abrasive, the inorganic salt, and the polishing accelerator having an acid group.

The temperature at which each component is mixed is not particularly limited, but is preferably 10° C. or higher and 40° C. or lower, and heating may be performed to increase the rate of dissolution. Further, the mixing time is not particularly limited as long as uniform mixing can be performed.

[Polishing Method and Method for Manufacturing the Semiconductor Substrate]

In the polishing method of the present invention, as a polishing apparatus (a polishing machine), a general polishing apparatus which includes a holder for holding a substrate or the like having an object to be polished, a motor whose rotation rate (rotational speed) can be changed and the like mounted therein and a polishing table to which a polishing pad (polishing cloth) can be attached can be used.

As the polishing pad, general non-woven fabric, polyurethane, porous fluororesin and the like can be used without particular limitation. The polishing pad is preferably subjected to groove processing so that a polishing liquid can be accumulated.

Regarding the polishing conditions, for example, the rotation rate of the polishing table is preferably rpm or more and 500 rpm or less. The pressure (polishing pressure) applied to the substrate having the object to be polished is preferably 0.5 psi or more and 10 psi or less. The method for supplying the polishing composition to the polishing pad is also not particularly limited, and for example, a continuous supply method using a pump or the like is adopted. Although the supply amount is not limited, it is preferable that the surface of the polishing pad is always covered with the polishing composition according to the present invention.

After the polishing is ended, the substrate is washed in running water, and the water droplets adhering to the substrate are wiped off by a spin dryer or the like and dried to obtain a substrate having a layer containing a metal.

The polishing composition used in the present invention may be a one-component (a single agent) type or a multi-component (a multi-agent) type including a two-component (a two-agent) type. Further, the polishing composition used in the present invention may be prepared by diluting the undiluted solution (the stock solution) of the polishing composition with a dilution solution such as water, for example, 10 times or more.

The polishing speed when the silicon germanium is polished by the polishing method of the present invention as described above is preferably 280 Å/min. or more, more preferably 400 Å/min. or more, and further preferably 600 Å/min. or more. Further, the etching amount of the silicon germanium when the silicon germanium is polished by the polishing method of the present invention is preferably 30 Å or less, more preferably 25 Å or less, and further preferably 20 Å or less. The polishing speed and the etching amount can be measured by the method described in the examples. Note that 1 Å=0.1 nm.

The polishing method of the present invention can be applied to an object to be polished containing the silicon germanium and other materials. In such case, the effect that the ratio of the polishing speed of the silicon germanium to the polishing speed of the other materials is sufficiently high (that is, the selection ratio is sufficiently high) can be obtained. For example, when the other material is silicon nitride, the ratio of the polishing speed of the silicon germanium to the polishing speed of the silicon nitride ([polishing speed of silicon germanium]/[polishing speed of silicon nitride]) is preferably 15 or more, more preferably 25 or more, further preferably 30 or more. Further, when the other material is silicon oxide, the ratio of the polishing speed of the silicon germanium to the polishing speed of the silicon oxide ([polishing speed of silicon germanium]/[polishing speed of silicon oxide]) is preferably 12 or more, more preferably 15 or more, further preferably 17 or more.

As described above, the polishing method of the present invention can be used for manufacturing a semiconductor substrate containing silicon germanium. Therefore, the present invention also provides a method for manufacturing a semiconductor substrate, which includes polishing a semiconductor substrate containing silicon germanium by the above polishing method.

Although an embodiment of the present invention has been described in detail, this is descriptive and exemplary and not limiting, and it is clear that the scope of the invention should be construed by the appended claims.

1. A polishing method including: polishing an object to be polished (an polishing object) containing silicon germanium using a polishing composition, in which the polishing composition contains an abrasive, an inorganic salt, and a polishing accelerator having an acid group, and pH of the polishing composition is 8 or more;

2. The polishing method according to 1. above, in which the polishing accelerator is at least one selected from the group consisting of N-(2-hydroxyethyl)ethylenediamine-N, N',N'-triacetic acid, N,N,N',N'-ethylenediaminetetrakis (methylenephosphonic acid), 2-phosphonobutane-1,2,4-tricarboxylic acid, N,N-di(2-hydroxyethyl)glycine, aspartic acid, and (S,S)-ethylenediamine-N,N'-disuccinic acid;

3. The polishing method according to 1. or 2. above, in which the polishing accelerator is N,N,N',N'-ethylenediaminetetrakis(methylenephosphonic acid);

4. The polishing method according to any of 1. to 3. above, in which the inorganic salt is at least one selected from the group consisting of ammonium nitrate, ammonium sulfate, ammonium hydrogen sulfate, triammonium phosphate, diammonium hydrogen phosphate, and ammonium dihydrogen phosphate;

5. The polishing method according to any of 1. to 4. above, in which the inorganic salt is ammonium sulfate.

6. The polishing method according to any of 1. to 5. above, in which a polishing speed of the silicon germanium is 280 Å/min. or more;

7. The polishing method according to any of 1. to 6. above, in which an etching amount of the silicon germanium is 30 Å or less;

8. The polishing method according to any of 1. to 7. above, in which the object to be polished further contains silicon nitride;

9. The polishing method according to 8. above, in which a ratio of polishing speed of the silicon germanium to polishing speed of the silicon nitride is 15 or more;

10. The polishing method according to any of 1. to 7. above, in which the object to be polished further contains silicon oxide;

11. The polishing method according to 10. above, in which a ratio of polishing speed of the silicon germanium to polishing speed of the silicon oxide is 12 or more;

12. A method for manufacturing a semiconductor substrate, including polishing the semiconductor substrate by the polishing method according to any of 1. to 11. above; and 13. A polishing composition used for polishing an object to be polished containing silicon germanium, in which the polishing composition contains an abrasive, an inorganic salt, and a polishing accelerator having an acid group, and pH of the polishing composition is 8 or more.

EXAMPLES

The present invention will be described in more detail with reference to the examples and comparative examples described below. However, the technical scope of the present invention is not limited to the examples described below. Unless otherwise specified, "%" and "part" mean "% by mass" and "part by mass" respectively. Further, in the examples described below, unless otherwise specified, the operation was performed under the conditions of room temperature (25° C.)/relative humidity of 40% RH or more and 50% RH or less.

As the abrasive, colloidal silica which has an average primary particle size of 34 nm and an average secondary particle size of 70 nm was used. The average primary particle size of the abrasive grains was calculated from the specific surface area of the abrasive grains by the BET method measured using "Flow Sorb II 2300" manufactured by Micromeritics Instruments Corporation and the density of the abrasive grains. Further, the average secondary particle size of the abrasive grains was measured by a dynamic light scattering type particle size/grain size distribution device, UPA-UTI151, manufactured by Nikkiso Co., Ltd.

The pH of the polishing composition (liquid temperature: 25° C.) was confirmed by a pH meter (manufactured by HORIBA, Ltd., model number: LAQUA).

Examples 1 to 13 and Comparative Examples 1 to 5

The abrasive, the inorganic salts and the polishing accelerator shown in Table 2 below were added so as to have the contents shown in Table 2 below relative to the total amount of the polishing composition. Further, an aqueous hydrogen peroxide solution (concentration: 31% by mass) was prepared as an oxidizing agent and added so as to have the content shown in Table 2 below relative to the total amount of the polishing composition. Further, as an antiseptic agent, an isothiazolin-based antiseptic agent was added so as to have a content of 0.1% by mass relative to the total amount of the polishing composition. These components were stirred and mixed in pure water (mixing temperature: about 25° C., mixing time: about 10 minutes) to prepare polishing compositions of Examples 1 to 13 and Comparative Examples 1 to 5. The pH of the polishing composition was adjusted by adding ammonia and confirmed with the pH meter.

[Polishing Speed]

The following wafers were prepared as objects to be polished:

Silicon germanium (SiGe) wafer: Silicon wafer with a 1500 Å-thick silicon germanium film (Si:Ge=50:50 mass ratio) formed on the surface (300 mm, blanket wafer, manufactured by Advanced Material Technology Co., Ltd.)

Silicon oxide (TEOS) wafer: Silicon wafer with a 10000 Å-thick silicon oxide film formed on the surface (300 mm, blanket wafer, manufactured by Advantec Co., Ltd.)

Silicon nitride (SiN) wafer: Silicon wafer with a 3500 Å-thick silicon nitride film formed on the surface (300 mm, blanket wafer, manufactured by Advantec Co., Ltd.)

Polishing speeds of the silicon germanium wafer, the silicon oxide wafer, and the silicon nitride wafer were obtained respectively when these wafers were polished for a certain period of time under the polishing conditions shown in Table 1 below using the polishing compositions of Examples 1 to 13 and Comparative Examples 1 to 5. The silicon germanium wafer, the silicon oxide wafer, and the silicon nitride wafer were used by couponing (cutting) a 300 mm substrate into 60 mm×60 mm.

[Table 1]

(Polishing Apparatus and Polishing Conditions)

Polishing apparatus: Single-sided CMP polishing machine Model EJ380IN (manufactured by Engis Japan Corporation)

Polishing pad: Product name H804-CZM (manufactured by Fujibo Ehime Co., Ltd.)

Polishing pressure: 1.8 psi (1 psi=6894.76 Pa)

Platen (table) rotation rate: 93 rpm

Head (carrier) rotation rate: 50 rpm

Supply method of polishing composition: flowing

Supply amount of polishing composition: 100 mL/min

Polishing time: 60 sec.

The polishing speed (polishing rate, polishing removal rate) was calculated by the formula described below.

$$\text{Polishing rate [Å/min]} = \frac{\text{Film thickness before polishing [Å]} - \text{Film thickness after polishing [Å]}}{\text{Polishing time [min]}} \quad [\text{Math. 1}]$$

The film thicknesses of the silicon oxide and the silicon nitride were determined by the light interference type film thickness measurement apparatus, Lambda Ace VM-2030 manufactured by SCREEN Semiconductor Solutions Co., Ltd., and evaluated by dividing the difference in film thickness before and after polishing by the polishing time.

The film thickness of the silicon germanium was determined by a scanning X-ray fluorescence apparatus, ZSX Primus 400 manufactured by Rigaku Corporation, and evaluated by dividing the difference in film thickness before and after polishing by the polishing time.

The selection ratio of the polishing speed was obtained by calculating the polishing speed of the silicon germanium/the polishing speed of the silicon oxide, and the polishing speed of the silicon germanium/the polishing speed of the silicon nitride.

[Etching Amount]

The silicon germanium wafer (Si:Ge=50:50 mass ratio) having a size of 30 mm×30 mm was immersed in the polishing composition rotated at 300 rpm using a stirrer at 43° C. for one hour, and the dissolution amount (etching amount) was calculated based on the difference in film thickness before and after the immersion.

The composition (the components and the content thereof) and evaluation results of each polishing composition are shown in Table 2 below. Note that in the column of polishing accelerator, EDTMP represents N,N,N',N'-ethylenediaminetetrakis(methylenephosphonic acid), PBTC represents 2-phosphonobutane-1,2,4-tricarboxylic acid, and PVA represents polyvinyl alcohol. Further, "-" in Table 2 indicates that such agents are not used.

TABLE 2

| | Polishing composition | | | | | | | | | | | | |
|---|---|---|---|---|---|---|---|---|---|---|---|---|---|
| | Abrasive | Inorganic salt | | Polishing accelerator | | | Oxidizing agent Hydrogen peroxide | Polishing speed (Å/min) | | | Polishing speed selection ratio | | SiGe Etching amount |
| | Content (% by mass) | Content (% by mass) | Type | Content (% by mass) | Type | pH | Content (% by mass) | SiGe | SiN | TEOS | SiGe/SiN | SiGe/TEOS | (Å) |
| Example 1 | 0.5 | 0.1 | Ammonium sulfate | 0.1 | EDTMP | 9.2 | 0.16 | 532 | 16 | 28 | 33.3 | 19.0 | 18 |
| Example 2 | 0.5 | 0.1 | Ammonium sulfate | 0.1 | EDTMP | 10.4 | 0.16 | 686 | 22 | 40 | 31.9 | 17.2 | 20 |
| Example 3 | 0.5 | 0.1 | Triammonium phosphate | 0.1 | EDTMP | 10.4 | 0.16 | 652 | 25 | 41 | 26.3 | 15.9 | 21 |
| Example 4 | 1.0 | 0.1 | Ammonium sulfate | 0.1 | EDTMP | 10.4 | 0.16 | 1372 | 43 | 62 | 31.9 | 22.1 | 23 |
| Example 5 | 0.25 | 0.1 | Ammonium sulfate | 0.1 | EDTMP | 10.4 | 0.16 | 343 | 11 | 21 | 31.9 | 16.3 | 19 |
| Example 6 | 0.5 | 0.05 | Ammonium sulfate | 0.1 | EDTMP | 10.4 | 0.16 | 339 | 10 | 22 | 32.9 | 15.4 | 14 |
| Example 7 | 0.5 | 0.2 | Ammonium sulfate | 0.1 | EDTMP | 10.4 | 0.16 | 1349 | 40 | 66 | 33.4 | 20.4 | 29 |
| Example 8 | 0.5 | 0.1 | Ammonium sulfate | 0.05 | EDTMP | 10.4 | 0.16 | 480 | 18 | 32 | 27.0 | 15.0 | 24 |
| Example 9 | 0.5 | 0.1 | Ammonium sulfate | 0.25 | EDTMP | 10.4 | 0.16 | 864 | 34 | 68 | 25.4 | 12.7 | 21 |
| Example 10 | 0.5 | 0.1 | Ammonium sulfate | 0.1 | EDTMP | 8.6 | 0.16 | 298 | 8 | 12 | 37.3 | 24.8 | 11 |
| Example 11 | 0.5 | 0.1 | Ammonium sulfate | 0.1 | EDTMP | 10.4 | 0.05 | 322 | 21 | 39 | 15.3 | 8.3 | 17 |
| Example 12 | 0.5 | 0.1 | Ammonium sulfate | 0.1 | EDTMP | 10.4 | 0.4 | 798 | 24 | 42 | 33.3 | 19.0 | 28 |
| Example 13 | 0.5 | 0.1 | Ammonium sulfate | 0.1 | PBTC | 9.2 | 0.16 | 363 | 7 | 30 | 49.2 | 12.1 | 23 |
| Comparative Example 1 | 0.5 | — | — | — | — | 9.2 | 0.16 | 25 | 2 | 2 | 14.8 | 12.4 | 23 |
| Comparative Example 2 | 0.5 | 0.1 | Ammonium sulfate | — | — | 9.2 | 0.16 | 155 | 5 | 5 | 29.1 | 31.0 | 23 |
| Comparative Example 3 | 0.5 | 0.1 | Ammonium sulfate | — | — | 10.4 | 0.16 | 274 | 14 | 30 | 19.5 | 9.1 | 52 |
| Comparative Example 4 | 0.5 | 0.1 | Triammonium citrate | 0.1 | EDTMP | 10.4 | 0.16 | 269 | 39 | 33 | 6.9 | 8.1 | 24 |
| Comparative Example 5 | 0.5 | 0.1 | Ammonium sulfate | 0.1 | PVA | 10.4 | 0.16 | 222 | 19 | 44 | 11.6 | 5.0 | 21 |

As is clear from Table 2 above, it was found that the polishing method of the examples had a sufficiently high polishing speed of silicon germanium and a small etching amount of silicon germanium as compared with the polishing method of the comparative examples. Further, it was also found that the ratio (selection ratio) of the polishing speed of the silicon germanium to the polishing speed of other materials other than silicon germanium was sufficiently high.

It was found that the polishing speed of the silicon germanium was low in the polishing methods of Comparative Examples 1 to 5. Moreover, it was found that in the polishing method of Comparative Example 3, the etching amount of the silicon germanium was large and in the polishing methods of Comparative Examples 4 and 5, the selection ratio was lowered.

The present application is based on Japanese Patent Application No. 2020-049610 filed on Mar. 19, 2020, the disclosure of which is incorporated herein by reference in its entirety.

What is claimed is:

1. A polishing method comprising:
   polishing an object to be polished containing silicon germanium using a polishing composition,
   wherein the polishing composition comprises a dispersing medium, an abrasive, an inorganic salt, and a polishing accelerator having an acid group, pH of the polishing composition is 8 or more, and the inorganic salt is at least one selected from the group consisting of ammonium nitrate, ammonium sulfate, ammonium hydrogen sulfate, and ammonium dihydrogen phosphate.

2. The polishing method according to claim 1, wherein the polishing accelerator is at least one selected from the group consisting of N-(2-hydroxyethyl)ethylenediamine-N,N',N'-triacetic acid, N,N,N',N'-ethylenediaminetetrakis(methylenephosphonic acid), 2-phosphonobutane-1,2,4-tricarboxylic acid, N,N-di(2-hydroxyethyl)glycine, aspartic acid, and (S,S)-ethylenediamine-N,N'-disuccinic acid.

3. The polishing method according to claim 1, wherein the polishing accelerator is N,N,N',N'-ethylenediaminetetrakis (methylenephosphonic acid).

4. The polishing method according to claim 1, wherein the inorganic salt is ammonium sulfate.

5. The polishing method according to claim 1, wherein a polishing speed of the silicon germanium is 280 Å/min. or more.

6. The polishing method according to claim 1, wherein an etching amount of the silicon germanium is 30 Å or less.

7. The polishing method according to claim 1, wherein the object to be polished further comprises silicon nitride.

8. The polishing method according to claim 7, wherein a ratio of polishing speed of the silicon germanium to polishing speed of the silicon nitride is 15 or more.

9. The polishing method according to claim 1, wherein the object to be polished further comprises silicon oxide.

10. The polishing method according to claim 9, wherein a ratio of polishing speed of the silicon germanium to polishing speed of the silicon oxide is 12 or more.

11. A method for manufacturing a semiconductor substrate, comprising polishing the semiconductor substrate by the polishing method according to claim 1.

12. The polishing method according to claim 1, wherein the polishing composition further comprises an oxidizing agent.

13. The polishing method according to claim 12, wherein the oxidizing agent is at least one selected from the group consisting of hydrogen peroxide, ammonium persulfate, periodic acid, hypochlorous acid, and sodium dichloroisocyanurate.

14. The polishing method according to claim 12, wherein the content of the oxidizing agent in the polishing composition is 0.01% by mass or more and 5% by mass or less.

15. The polishing method according to claim 1, wherein the content of the polishing accelerator in the polishing composition is 0.08% by mass or more and 5% by mass or less.

16. The polishing method according to claim 1, wherein the content mass ratio of the abrasive and the polishing accelerator in the polishing composition is 1/1 to 13/1.

17. A polishing method comprising polishing an object to be polished containing silicon germanium using a polishing composition, wherein the polishing composition essentially consists of:
a dispersing medium;
an abrasive;
an inorganic salt, wherein the inorganic salt is at least one selected from the group consisting of ammonium nitrate, ammonium sulfate, ammonium hydrogen sulfate, and ammonium dihydrogen phosphate;
a polishing accelerator;
an oxidizing agent;
an antiseptic agent or an antifungal agent; and
a pH adjusting agent, wherein the pH adjusting agent is at least one selected from the group consisting of acids and ammonia, and
wherein the pH of the polishing composition is 8 or more.

* * * * *